United States Patent
Atsumi et al.

(10) Patent No.: US 6,643,183 B2
(45) Date of Patent: *Nov. 4, 2003

(54) CHANNEL-ERASE NONVOLATILE SEMICONDUCTOR MEMORY DEVICE

(75) Inventors: Shigeru Atsumi, Yokohama (JP); Tadayuki Taura, Zushi (JP); Toru Tanzawa, Ebina (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/196,957

(22) Filed: Jul. 19, 2002

(65) Prior Publication Data

US 2002/0181288 A1 Dec. 5, 2002

Related U.S. Application Data

(60) Continuation of application No. 10/081,532, filed on Feb. 25, 2002, now Pat. No. 6,445,618, which is a division of application No. 09/536,391, filed on Mar. 28, 2000, now Pat. No. 6,373,749.

(30) Foreign Application Priority Data

Apr. 9, 1999 (JP) ............................................ 11-102978

(51) Int. Cl.[7] .......................... G11C 16/04; G11C 16/06
(52) U.S. Cl. ............................. 365/185.27; 365/185.29; 365/185.23
(58) Field of Search ...................... 365/185.27, 185.29, 365/185.23

(56) References Cited

U.S. PATENT DOCUMENTS

| 5,280,454 | A |   | 1/1994  | Tanaka et al. |
| 5,392,253 | A |   | 2/1995  | Atsumi et al. |
| 5,438,542 | A | * | 8/1995  | Atsumi et al. ............... 365/182 |
| 5,513,146 | A |   | 4/1996  | Atsumi et al. |
| 5,600,592 | A |   | 2/1997  | Atsumi et al. |
| 5,680,349 | A |   | 10/1997 | Atsumi et al. |
| 5,729,494 | A |   | 3/1998  | Gotou et al. |
| 5,901,083 | A |   | 5/1999  | Atsumi et al. |
| 5,999,455 | A |   | 12/1999 | Lin et al. |
| 6,046,627 | A |   | 4/2000  | Itoh et al. |
| 6,130,844 | A |   | 10/2000 | Zerilli |
| 6,333,662 | B1|   | 12/2001 | Umezawa et al. |
| 6,373,749 | B1| * | 4/2002  | Atsumi et al. ......... 365/185.29 |

OTHER PUBLICATIONS

Toshikatsu Jinbo, et al., "TP 9.4: A 5V–Only 16Mb Flash Memory with Sector–Erase Mode", 1992 IEEE International Solid–State Circuits Conference, pp. 154–155.

* cited by examiner

*Primary Examiner*—Richard Elms
*Assistant Examiner*—Jung H. Hur
(74) *Attorney, Agent, or Firm*—Banner & Witcoff, Ltd.

(57) ABSTRACT

In a channel-erase EEPROM, there is a parasitic capacitance between node N1 to which a substrate voltage is supplied and node N2 to which the voltage on a word line is supplied. A negative voltage is applied to the word line in erasing the data in a memory cell. A switch circuit SW1 is connected between node N1 and node N2. Between node N1 and the ground, a switch SW4 is connected. A switch SW5 is connected between node N2 and the ground. When the erase operation has been completed, the switch circuit SW1 is first turned on, short-circuiting node N1 and node N2. Thereafter, the switch circuits SW4, SW5 are turned on, grounding node N1 and node N2 separately.

8 Claims, 9 Drawing Sheets

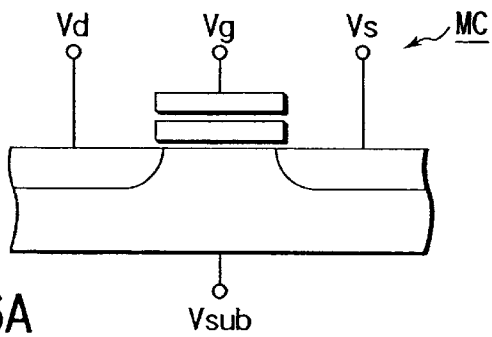
FIG. 6A
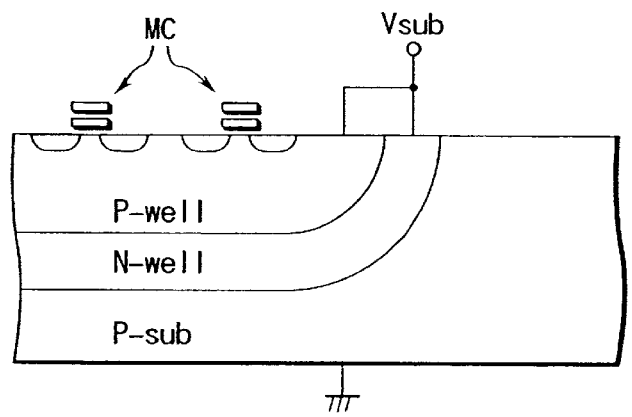
FIG. 6B
FIG. 6C
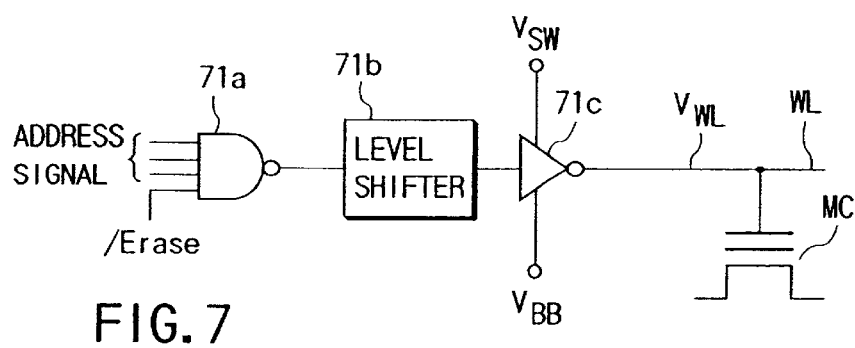
FIG. 7

CHANNEL-ERASE NONVOLATILE SEMICONDUCTOR MEMORY DEVICE

CROSS-REFERENCE TO RELATED APPLICATIONS

This application is a continuation of U.S. patent application Ser. No. 10/081,532, filed Feb. 25, 2002, now U.S. Pat. No. 6,445,618 B1, issued Sep. 3, 2002, which is a divisional of U.S. patent application Ser. No. 09/536,391, filed Mar. 28, 2000, now U.S. Pat. No. 6,373,749 B1, issued Apr. 16, 2002, which is based upon and claims the benefit of priority from the prior Japanese Patent Application No. 11-102978, filed Apr. 9, 1999, the entire contents of which are incorporated herein by reference.

BACKGROUND OF THE INVENTION

This invention relates to a nonvolatile semiconductor memory device, such as a flash EEPROM.

It is well known that a flash memory uses stacked-gate transistors as memory cells. A NOR flash EEPROM generally uses channel hot electrons in a write operation and FN tunnel current in an erase operation. There have been various methods of erasing data. For example, in an ETOX (EPROM Tunnel Oxide), a type of Intel's flash memory, an electric field is applied between the floating gate and the source by grounding the gate of a cell and applying a high voltage (about 10 V) to its source, thereby causing FN tunnel current to flow. Moreover, in the negative gate-source erasing method proposed by AMD Corp., a negative voltage (about −10 V) is applied to the gate of a cell in an erase operation and a positive voltage (about 5 V) is applied to its source, thereby causing FN tunnel current to flow between the floating gate and the source.

As the cell size is scaled down, a high voltage applied to the source of a cell in an erase operation becomes a problem. Use of a double diffused structure for the source region can be considered to improve the junction breakdown voltage so that the junction may withstand a high voltage. Specifically, an N$^+$(As) region as the source region is covered with an N$^-$(P) region, thereby improving the breakdown voltage. The double diffused structure, however, is a factor that prevents the channel length from being scaled down. Specifically, when an N$^-$ region is formed to secure a sufficient breakdown voltage, the overlap length $Y_j$ of the diffused layer and the gate increases. The overlap length $Y_j$ is estimated at about 0.2 μm. When the devices are miniaturized further and particularly the coming generation of 0.25 μm or less in size is taken into account, the channel length L including the $Y_j$ part is:

$$L = Leff + 0.2 \, \mu m >> 0.25 \, \mu m$$

where Leff is the effective channel length.

Thus, the channel length has a significantly adverse effect on the reduction of the cell size.

To overcome this problem, a channel erasing method has been developed. In this method, a high voltage is applied between the substrate (=source) and the word line, thereby causing tunnel current to flow between the floating gate and the substrate. Since the substrate and source have the same potential (the source may be in the floating state), there is no need to take into account the junction breakdown voltage of the source, eliminating the necessity of a double diffused structure.

However, since the method has a large capacity between the floating gate and the substrate, a high voltage must be applied between the gate of the cell and the substrate in an erase operation, as compared with the source erasing method. Therefore, the breakdown voltages of the transistors constituting a decode circuit for supplying a specific voltage to the gate of a cell (word line) or a decode circuit for supplying a specific voltage to the substrate become a problem. To avoid this, the voltages at various sections have been considered to prevent the breakdown voltages of those transistors from becoming a problem.

FIGS. 6A, 6B, and 6C show the relationship between the bias voltages supplied to various sections of a memory cell. As shown in FIGS. 6A and 6B, to suppress the breakdown voltage to a lower level, it is desirable that a negative voltage (Vg=−8 V) should be applied to the control gate of a cell in an erase operation and a positive high voltage (Vsub=10 V) should be applied to the substrate. In the case of channel erasing, a memory cell MC is formed in a p-type well isolated from a p-type substrate by an n-type well. A substrate voltage Vsub in the cell is supplied to the p-type well and n-type well.

With the method, a decode circuit can be composed of transistors with a breakdown voltage of 10 V. In contrast, an attempt to cause only the control gate or substrate to have resistance to voltage requires transistors with a breakdown voltage of about 20 V. Thus, as the breakdown voltage of the transistor increases, tox. (the film thickness of the oxide film), L (the channel length), and the like must be twice those of a transistor with a breakdown voltage of 10 V. This makes the decode circuit larger. Consequently, the area the decode circuit occupies on the chip is enormous.

FIGS. 7 to 9 show examples of circuits for applying a channel erase bias voltage to various section of a cell.

FIG. 7 shows an example of a row decode circuit (word line driver). In the row decode circuit, a logic circuit 71a decodes address signals in a voltage 0–Vdd system and an Erase signal. The decode output signal from the logic circuit 71a is converted by a level shifter 71b into signals in a voltage $V_{SW}$, $V_{BB}$ system. The voltage $V_{SW}$ is the high level of the word line and the voltage $V_{BB}$ is the low level of the word line. The output signal of the level shifter 71b is supplied as a voltage $V_{WL}$ to the word line via an inverter circuit 71c acting as a driving circuit.

FIG. 9 shows the voltage $V_{WL}$ on a word line. In this way, the voltage $V_{WL}$ on the word line is set according to the reading, programming, and erasing of the data. The absolute value of each of the voltage $V_{SW}$, $V_{BB}$ is set at 10 V or less, which satisfies the breakdown condition of the transistors in the decode circuit.

FIG. 8 shows an example of the configuration of the level shifter shown in FIG. 7.

FIG. 10 shows an example of a decode circuit for supplying a potential to a substrate (p-type well) in which a cell array is formed. In the decode circuit, a logic circuit 100a decodes a block address signal and an Erase signal. The decode output signal of the logic circuit 100a is supplied to a level shifter 100b, which converts it into a voltage $V_H$ and a signal of the ground level. The voltage $V_H$ is, for example, 10 V. The output signal of the level shifter 100b is supplied to a p-type well via an inverter circuit 100c acting as a driving circuit.

A problem encountered in realizing the negative gate channel erasing method will be explained.

FIG. 11 is a sectional view of an n-channel transistor (NMOS), a p-channel transistor (PMOS) and a memory cell (MC) in the decoder. FIG. 12 shows an equivalent circuit of FIG. 11. There are parasitic capacitances C1 to C5 between the n-channel transistor, p-channel transistor, and memory cell. FIG. 13 shows an equivalent circuit of the parasitic capacitances C1 to C5. The parasitic capacitances C1 to C5 are as follows:

C1: a capacitance between the control gate of a memory cell and the substrate (p-type well)=a series capacitance of (a capacitance between the control gate and the floating gate) and (a capacitance between the floating gate and the substrate).

C2: a capacitance between a block substrate (n-type well or p-type well) and the substrate.

C3: a capacitance between the high level in the decoder (n-type well) and the substrate.

C4: a capacitance between the high level ($V_{SW}$) and low level ($V_{BB}$) in the decoder.

C5: a capacitance between the low level ($V_{BB}$) in the decoder and the substrate.

After an erase operation has been completed, this type of nonvolatile semiconductor memory device has to be reset to the state that allows a read operation. Specifically, the voltage $V_{WL}$ on the word line must be changed from −8 V to 0 V and the voltage $V_{well}$ at the well must be changed from 10 V to 0 V. A problem encountered in resetting the voltage on the word line and the voltage at the well is the order in which the respective nodes are reset.

FIGS. 14 and 15 illustrate how each node is reset after the completion of the erasure, using extreme examples.

FIG. 14 shows operating waveforms in a case where the voltage $V_{WL}$ ($V_{BB}$=−8 V) on the word line is reset earlier than the voltage at the well. When the $V_{WL}$ on the word line changes from −8 V to 0 V, the potential $V_{well}$ at the well rises because of a capacitance C1 shown in FIG. 11. As shown in FIG. 10, the $V_{well}$ is driven by an inverter circuit 100c to which a voltage $V_H$ and the ground potential are supplied as a power source. For this reason, as shown in FIGS. 16A and 16B, as the potential $V_{well}$ at the well rises, a forward bias from the voltage $V_{well}$ to the voltage $V_H$ is generated between the diffused layer of the p-channel transistor constituting the inverter circuit 100c and the n-type well.

In this state, in the worst case, a bipolar transistor to whose base the voltage $V_H$ is supplied is formed between the diffusion layer to which the voltage $V_{well}$ is supplied and the substrate, thereby releasing a lot of holes into the substrate. This can trigger latch-up.

On the other hand, when the voltage $V_{BB}$ changes relatively slow, a rise in the well potential $V_{well}$ causes the voltage $V_H$ to rise via a p-channel transistor. Since the voltage $V_H$ has been set at the maximum voltage 10 V, if the voltage $V_H$ rises any further, this causes the breakdown voltage problem of the transistors.

FIG. 15 shows operating waveforms in a case where the well potential is reset earlier than the potential on the word line. FIGS. 17A and 17B show decode circuits for a word line and a well.

In this case, when the $V_{well}$ to is reset, the voltage $V_{WL}$ on the word line undershoots because of the capacitance C1 coupling with the well voltage as shown in FIGS. 17A and 17B. In this state, as shown in FIG. 17B, a forward bias develops in the diffused layer of the n-channel transistor in the p-type well, which can give rise to latch-up in the worst case.

On the other hand, when the voltage on the well changes slowly, the voltage $V_{BB}$ is lowered and undershoots. In the case where the voltage $V_{SW}$−$V_{BB}$ in the row decode circuit is set at about the maximum voltage of 10 V, when the voltage $V_{BB}$ undershoots, this means that the $V_{BB}$ exceeds 10 V. Accordingly, the breakdown voltage of the transistor must be raised.

Both of the above examples are about extreme cases. However, when an attempt is made to reset the voltage $V_{WL}$ and the voltage $V_{well}$ at the same time in completing an erase operation, the aforementioned cases never fail to take place, taking into account the internal parasitic capacitances, resistances, other electrical characteristics, and temperature characteristics. Therefore, provision has to be made to prevent a forward bias from developing or the breakdown voltages of the transistors from deteriorating in any case.

BRIEF SUMMARY OF THE INVENTION

It is, accordingly, an object of the present invention to overcome the above disadvantages by providing a nonvolatile semiconductor memory device capable of not only preventing a forward bias between the diffused layer of a transistor and the substrate by a parasitic capacitance in resetting the potential between two nodes having a potential difference higher than the supply voltage, but also avoiding the breakdown voltage problem of the transistor.

The foregoing object is accomplished by providing a semiconductor memory device comprising: a first and a second node which have a potential difference equal to or higher than a supply voltage between them and are connected to each other via a parasitic capacitance; a first switch circuit which is connected between the first and second nodes; a second switch circuit which is connected between the first node and the ground; a third switch circuit which is connected between the second node and the ground; and a control circuit for controlling the first switch circuit.

Furthermore, the foregoing object is accomplished by providing a semiconductor memory device comprising: a memory cell array divided into blocks, each of the blocks including memory cells, word lines and bit lines being connected to these memory cells, and a row decoder for selecting the word lines; a first decoder for supplying the voltage supplied to the word lines to the row decoder; a second decoder for supplying a substrate voltage to a substrate in which the memory cells are formed; a first switch circuit which is connected between a first node to which the substrate voltage is supplied and a second node to which the voltage on the word line is supplied, the first and second nodes being connected to each other via a parasitic capacitance; a second switch circuit which is connected between the second node and the output terminal of the first decoder; and a third switch circuit which is connected between the first node and the output terminal of the second decoder.

Still furthermore, the foregoing object is accomplished by providing a semiconductor memory device comprising: memory cells formed in a well, each of the memory cells including a stacked-gate transistor where a floating gate and a control gate are stacked one on top of the other, a negative voltage being applied to the control gate of each of the memory cells in an erase operation, and the data in each of the memory cells being erased electrically at the same time by applying a positive voltage to the well; a first switch circuit which is connected between a first node for supplying a voltage to the well and a second node for supplying a voltage to the control gate of the memory cell, the first and second nodes being connected to each other via a parasitic capacitance; a second switch circuit which is connected between the first node and the ground; and a third switch circuit which is connected between the second node and the ground.

According to the present invention, there is provided a nonvolatile semiconductor memory device capable of not only preventing a forward bias between the diffused layer of a channel transistor and the substrate by a parasitic capacitance in resetting the potential between two nodes having a potential difference higher than the supply voltage, but also avoiding the breakdown voltage problem of the transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A shows the relationship between the bias voltages supplied to various sections of a memory cell, FIG. 6B is a table listing a concrete example of the bias voltages shown in FIG. 6A, and FIG. 6C is a sectional view to explain the relationship between the memory cell and well;

FIG. 7 shows the configuration of an example of the row decode circuit (word-line driver);

DETAILED DESCRIPTION OF THE INVENTION

Hereinafter, referring to the accompanying drawings, embodiments of the present invention will be explained.

As described earlier, there is a parasitic capacitance C1 between the control gate of a cell and the substrate. The aforementioned problem occurs when either the control gate or the substrate is grounded, while such a high voltage (about 20 V) as causes tunnel current to flow is being applied to the control gate and the substrate. Specifically, a voltage equivalent to the breakdown voltage of the transistor has been applied to the word line or well in the erased state. Thus, when one of the control gate or substrate is grounded in this state, the parasitic capacitance C1 permits the voltage at the well or the voltage on the word line to overshoot or undershoot. When the overshooting or undershooting takes place, a forward bias develops or the breakdown voltage problem of the transistor arises.

In the present invention, to overcome these problems, before the voltage $V_{WL}$ on the word line or the voltage $V_{well}$ on the well are grounded, the voltage difference between the voltages $V_{WL}$ and $V_{well}$ is removed. Specifically, before a reset operation following an erase operation, the voltages $V_{WL}$ and $V_{well}$ are short-circuited to bring the voltage applied to both ends of the parasitic capacitance C1 to 0 V. After the short-circuiting has been done, the word-line voltage and well voltage are reset.

Figure 1A:
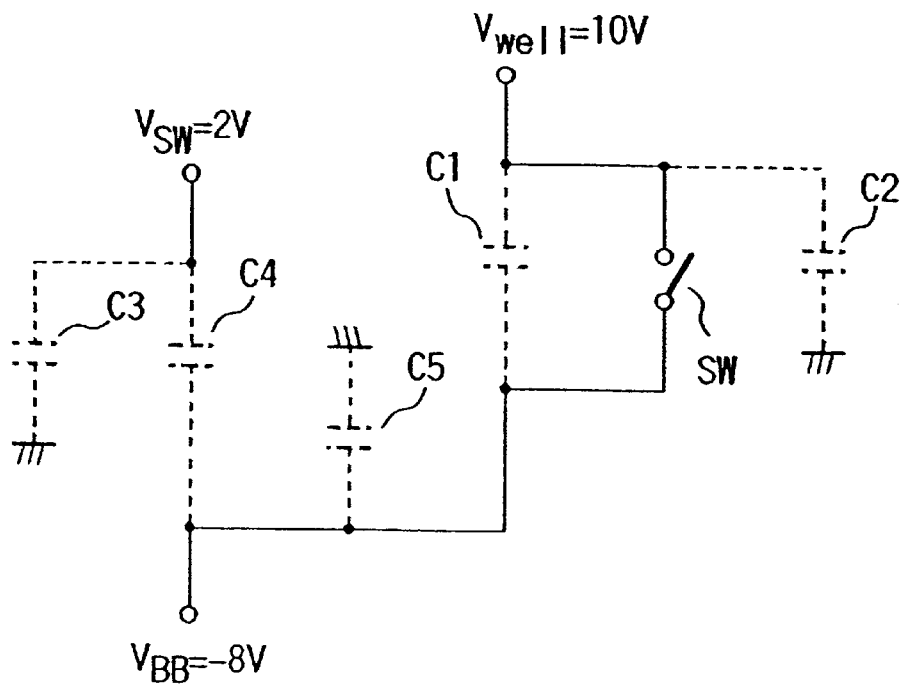
FIG. 1A is an equivalent circuit diagram showing the basic principle of the present invention.
Figure 1B:
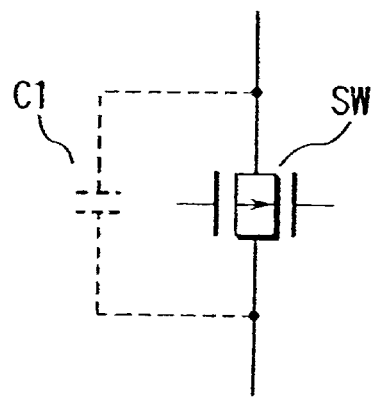
FIG. 1B is a circuit diagram of an example of the switch circuit shown in FIG. 1A.

FIGS. 1A and 1B are circuit diagrams to explain the basic principle of the present invention. As shown in FIG. 1A, a switch SW is connected in parallel with the parasitic capacitance C1 between the control gate and substrate. As shown in FIG. 1B, the switch SW is composed of, for example, a transfer gate. After the memory cell has been erased, the switch SW is first turned on, short-circuiting both ends of the parasitic capacitance C1, which brings the potential difference between the voltage $V_{WL}$ on the word line and the voltage $V_{well}$ at the well to 0 V. Because the potential at both ends of the parasitic capacitance C1 is at the midpoint between the high level $V_H$ (10 V) of the well voltage and low level $V_{BB}$ (−8 V) on the word line, there is no fear of a forward bias.

To perform a reset operation, each node of the parasitic capacitance C1 is grounded, with both ends of the parasitic capacitance C1 being grounded. Alternatively, after the short-circuiting has been canceled, each node of the parasitic capacitance C1 may be grounded separately. To realize the reset operation, a switch circuit explained later is connected between each node of the parasitic capacitance C1 and the ground.

With the above configuration, after the potential difference between both nodes of the parasitic capacitance C1 has been made zero by causing the switch circuit SW to short-circuit the parasitic capacitance C1, each node of the parasitic capacitance is grounded. Therefore, it is possible to avoid a forward bias problem and a breakdown voltage problem with the transistors constituting the decode circuit.

First Embodiment

In the above explanation of the basic principle, the case where short-circuiting is done ideally has been used. Actual short-circuiting, however, requires further improvements.

As described above, a voltage of about 20 V is applied to both ends of the parasitic capacitance C1 in an erase operation. Thus, as shown in FIG. 1B, when the capacitance C1 is short-circuited using a transfer gate composed of ordinary transistors, the transistors constituting the transfer gate are required to have a breakdown voltage of about 20 V. In the explanation until now, the voltages applied to all the transistors have been assumed to be 10 V or less. The reason is that the miniaturization of circuit elements is indispensable for making the size of the decode circuit appropriate. If the short-circuiting transistor is required to have a breakdown voltage of 20 V or higher, that part of the transistor has to be a special high-breakdown-voltage element. Because the introduction of a specific element makes the manufacturing processes complex and leads to a rise in the production cost, it is not a good solution.

A first embodiment of the present invention provides a circuit for short-circuiting a negative and a positive voltage without using a special high-breakdown-voltage element.

Figure 2A:
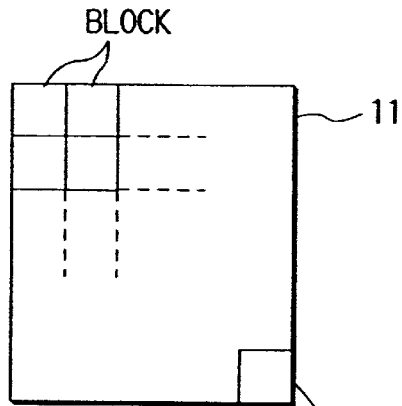
FIG. 2A is a schematic plan view of a memory cell array in a nonvolatile semiconductor memory device according to a first embodiment of the present invention.
Figure 2B:
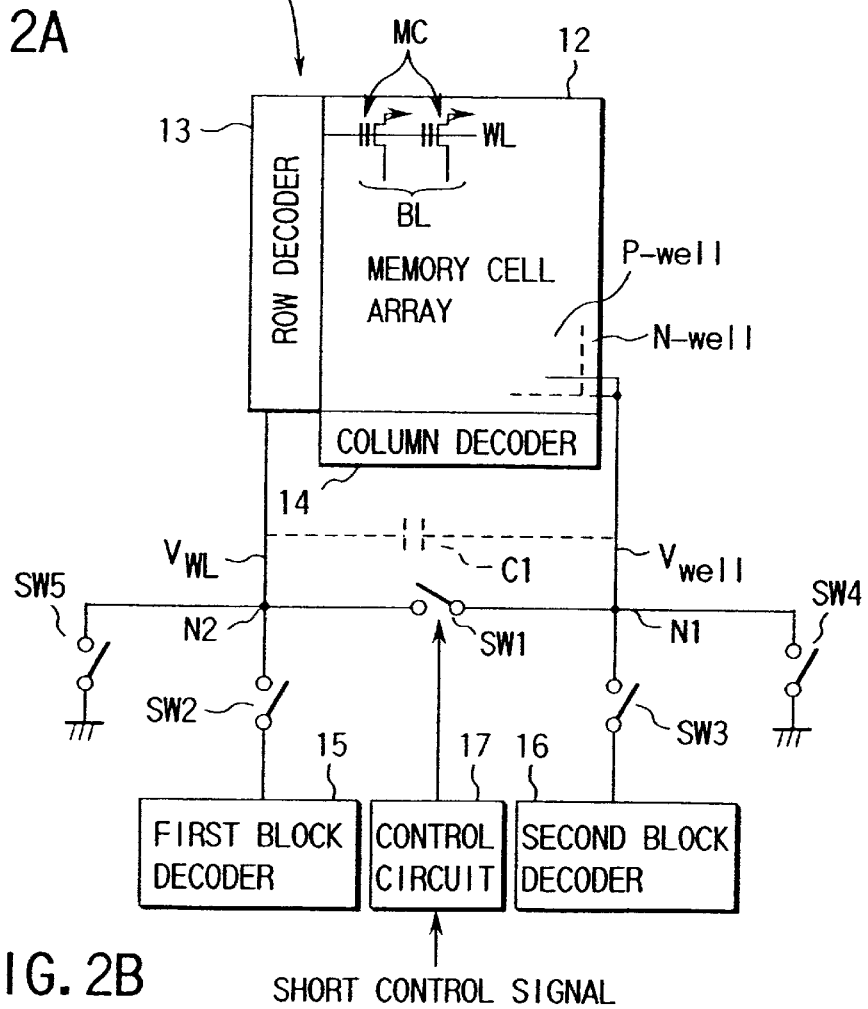
FIG. 2B shows the configuration of one block in FIG. 2A.

FIGS. 2A and 2B show a case where the present invention has been applied to a nonvolatile semiconductor memory device, such as a NOR flash memory. The flash memory has a memory capacity of, for example, 32 Mbits. In FIG. 2A, a memory cell array 11 is divided into 64 blocks. One block contains 64 Kbytes. Erasing is done in blocks.

As shown in FIG. 2B, each block includes a memory cell array 12 in which memory cells MC are arranged in rows and columns, a row decoder 13 for selecting a word line WL in the memory cell array 12, and a column decoder 14 for selecting a bit line BL. A first block decoder 15 is connected to the row decoder 13. A second block decoder 16 is connected to a p-type well and an n-type well in the memory cell array 12. The first block decoder 15 generates a voltage $V_{WL}$ for driving a word line according to the operation of reading, programming, or erasing the data. Specifically, the first block decoder 15 generates a voltage $V_{BB}$ (−8 V) as the low level on a word line in an erase operation. In a non-erase operation, it generates the ground potential as the low level. The second block decoder 16 generates a voltage $V_{well}$ at the substrate according to the operation of reading, programming, or erasing the data. Specifically, the second block decoder 16 generates a voltage $V_H$ (10 V) in an erase operation and the ground potential in a non-erase operation.

Figures 8, 9:
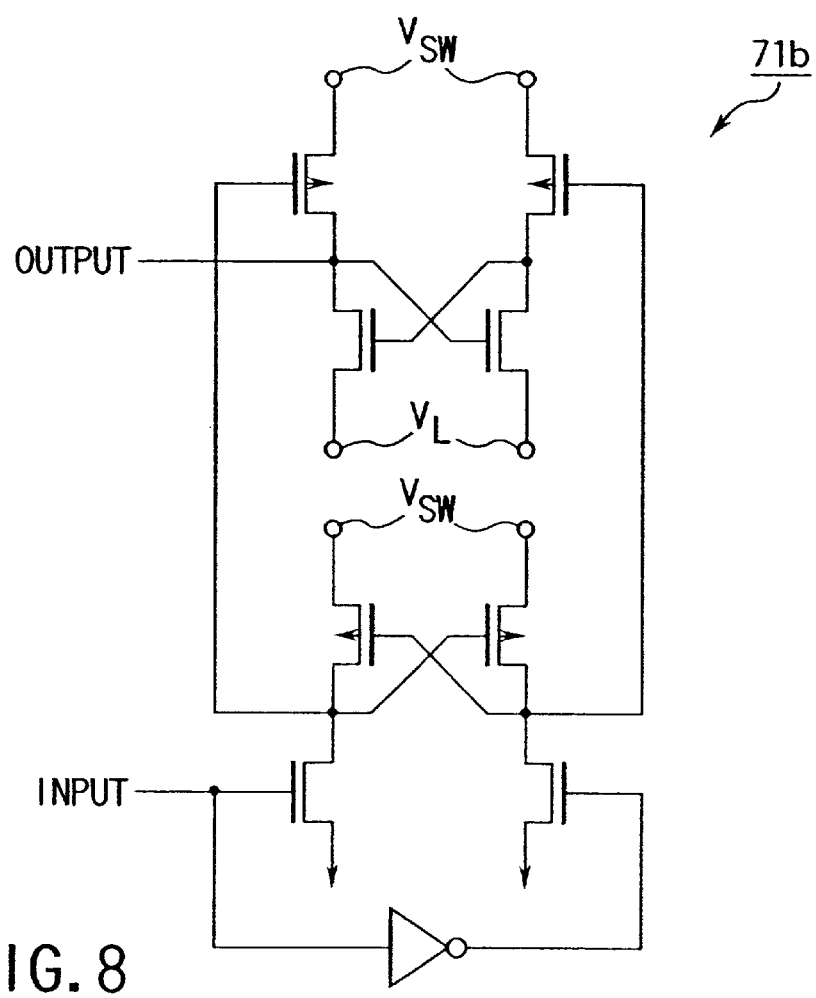
FIG. 8 is a circuit diagram of an example of the level shifter shown in FIG. 7.
FIG. 9 is a table listing the voltage $V_{WL}$ on the word line.
Figure 10:
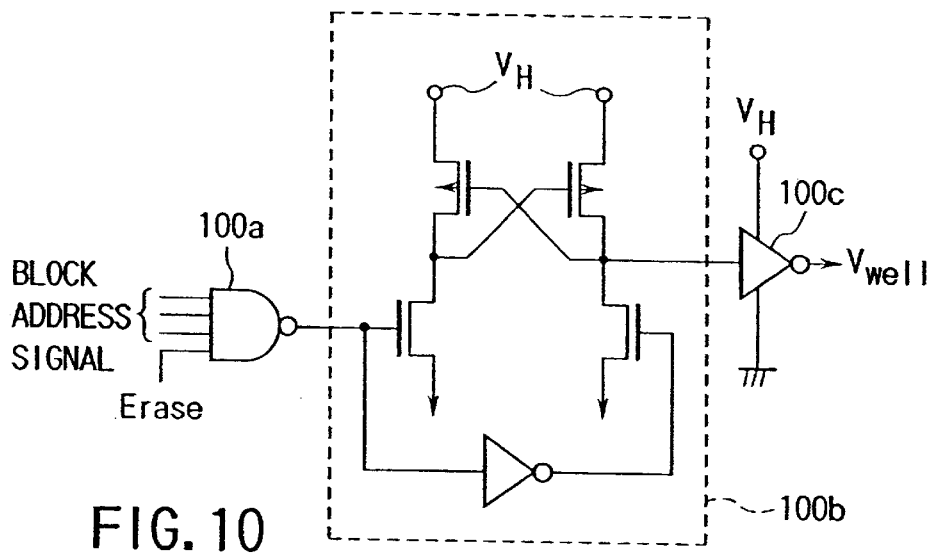
FIG. 10 is a circuit diagram of an example of the decode circuit for supplying the substrate potential.
Figure 11:
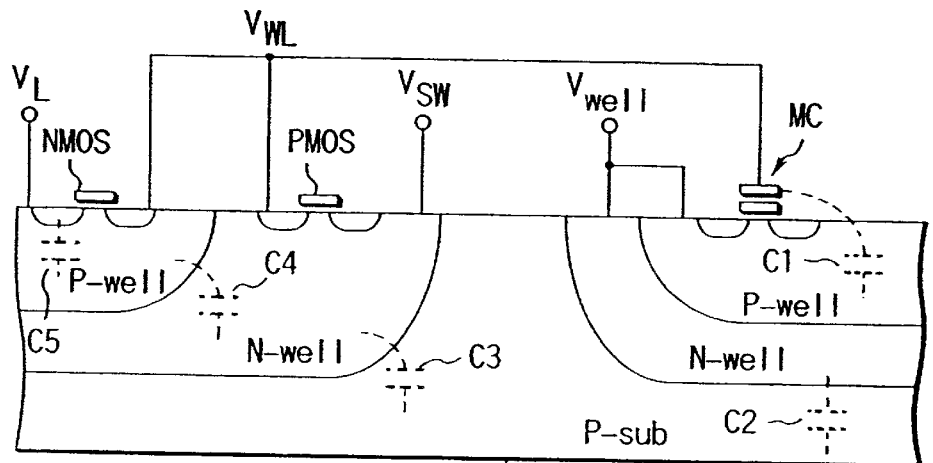
FIG. 11 is a sectional view of transistors and memory cells constituting the decode circuit.
Figure 12:
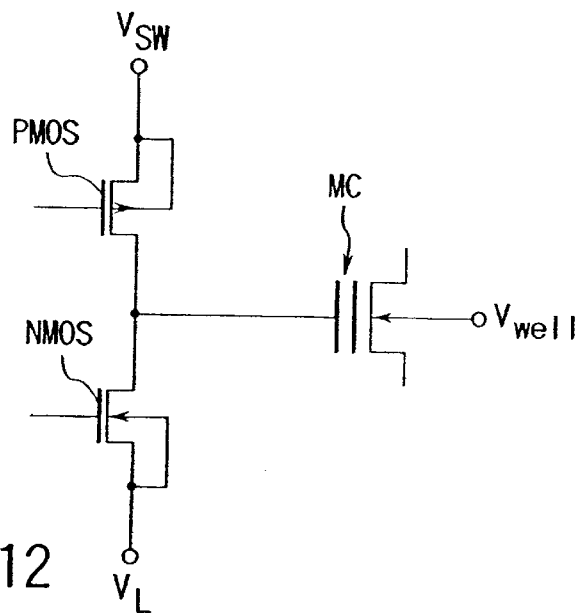
FIG. 12 is a circuit diagram of an equivalent circuit in FIG. 11.
Figure 13:
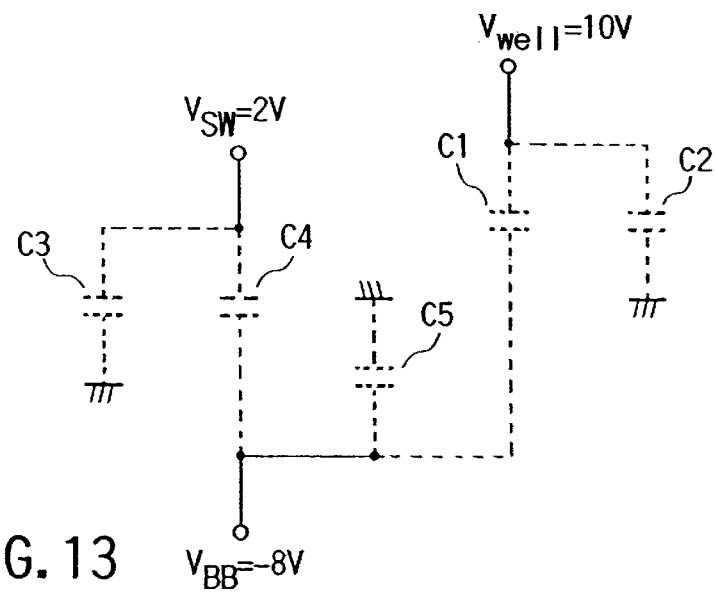
FIG. 13 is an equivalent circuit diagram to explain the parasitic capacitances in FIG. 11.
Figure 14:
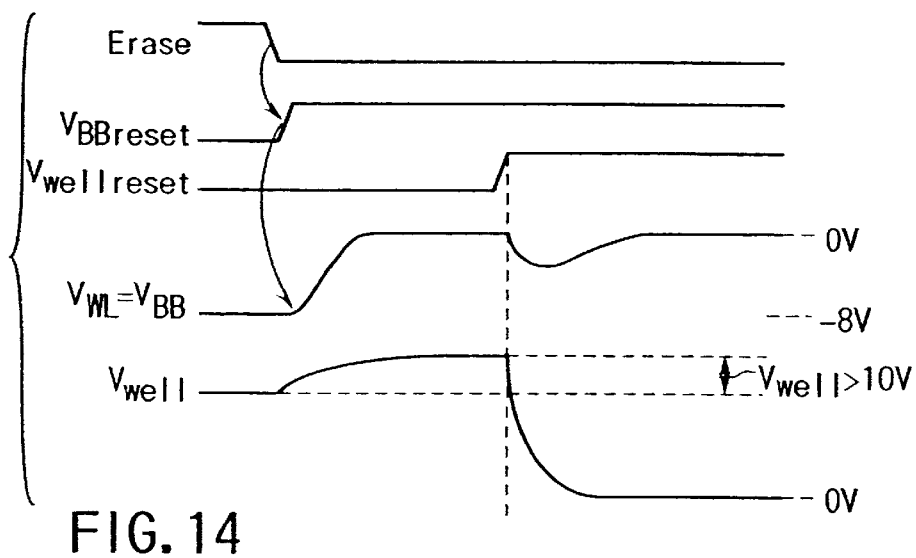
FIG. 14 is a waveform diagram to explain the operation in resetting the voltage on the word line earlier than the voltage at the well.
Figure 15:
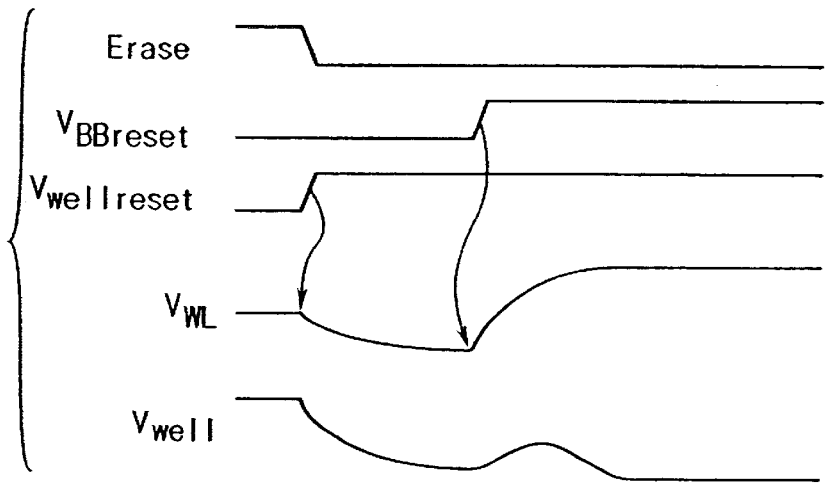
FIG. 15 is a waveform diagram to explain the operation in resetting the well potential earlier than the potential on the word line.
Figure 16A:
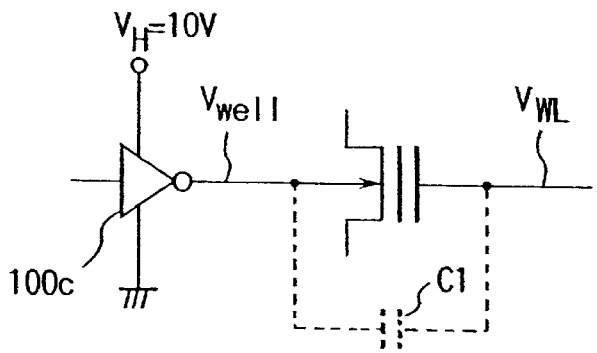
FIG. 16A is an equivalent circuit diagram to explain the problem encountered in the operation of FIG. 14.
Figure 16B:
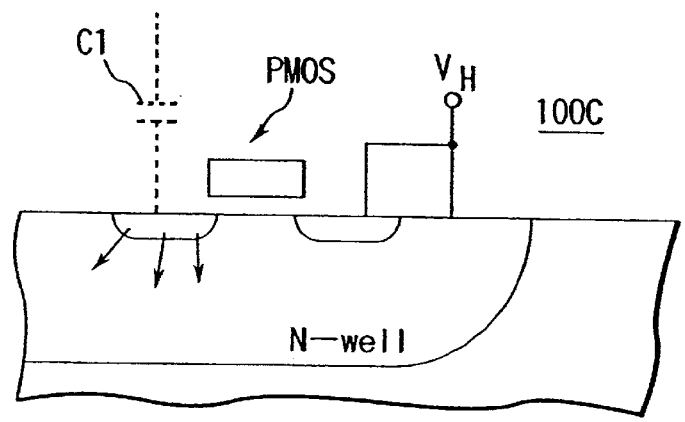
FIG. 16B is a sectional view of part of FIG. 16A.
Figure 17A:
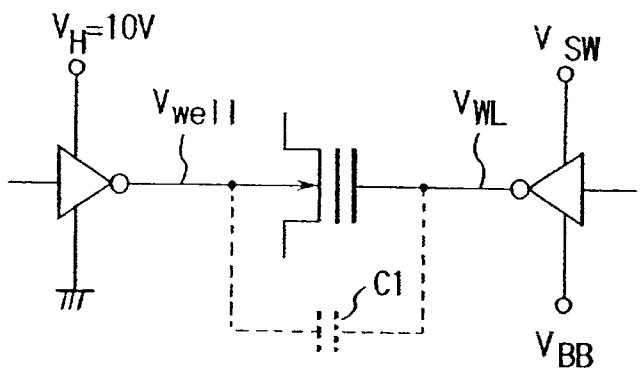
FIG. 17A is an equivalent circuit diagram to explain the problem encountered in the operation of FIG. 15.
Figure 17B:
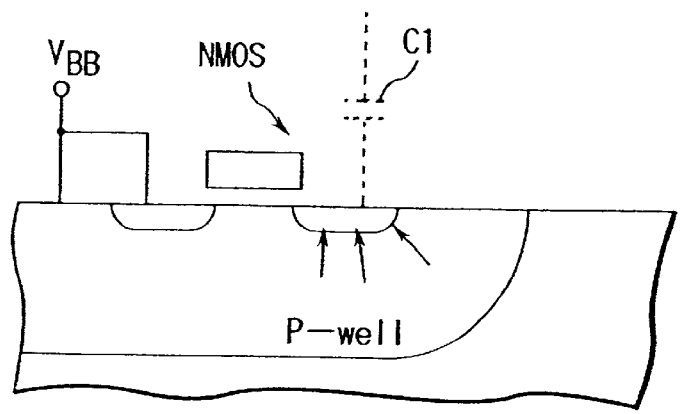
FIG. 17B is a sectional view of part of FIG. 17A.

The memory cell array 12 has the same configuration as that of FIG. 11. The first block decoder 15 has the same configuration as that of FIGS. 7 and 8. The second block decoder 16 has the same configuration as that of FIG. 10.

A switch circuit SW1 is connected between the row decoder 13 and the substrate. In response to the signal from a control circuit 17, the switch circuit SW1 short-circuits a parasitic capacitance C between the control gate of a cell and the p-type well after the completion of the erase operation and before a reset operation. A switch circuit SW2 is connected between the first block decoder 15 and row decoder 13. A switch circuit SW3 is connected between the second block decoder 16 and the substrate. A switch circuit SW4 is connected between node N1 to which the switch circuits SW1 and SW3 are connected and the ground. A switch circuit SW5 is connected between node N2 to which the switch circuits SW1 and SW2 are connected and the ground.

Figure 3:
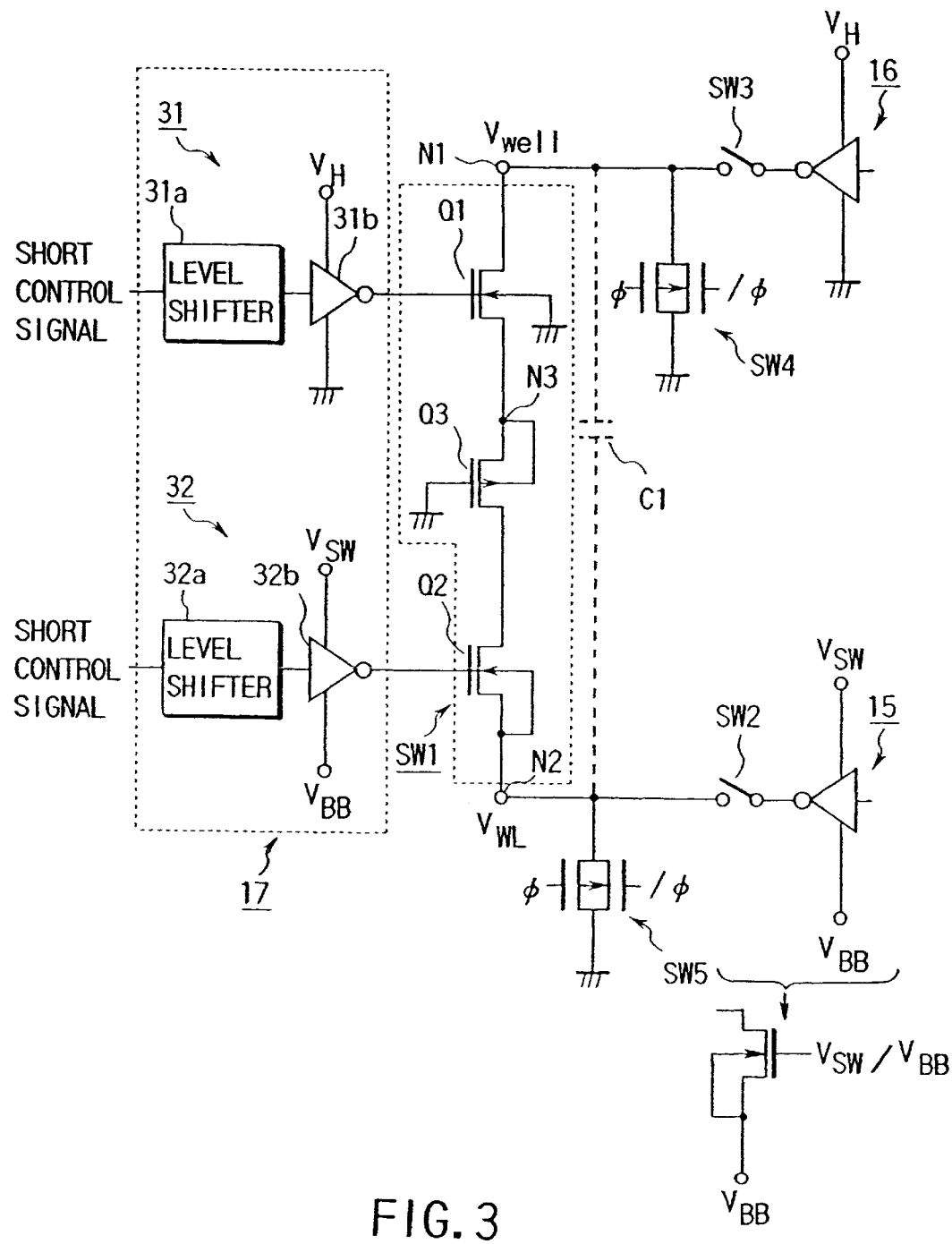
FIG. 3 is a circuit diagram showing the main parts of FIG. 2.

FIG. 3 is a circuit diagram showing the main part of FIG. 2 concretely. The same parts as those of FIG. 2 are indicated by the same reference symbols. The switch circuit SW1 is composed of n-channel transistors Q1, Q2 and a p-channel transistor Q3. These n-channel transistors Q1, Q2 and p-channel transistor Q3 are connected in such a manner that Q1, Q3, and Q2 are connected in series in this order between node N1 to which the substrate voltage $V_{well}$ is supplied and node N2 to which the voltage $V_{WL}$ on the word line is supplied. A driving circuit 31 is connected to the gate of the n-channel transistor Q1. A driving circuit 32 is connected to the gate of the n-channel transistor Q2. These driving circuits 31, 32 constitute the control circuit 17.

The driving circuit 31 is composed of a level shifter 31a for generating a voltage $V_H$ or the ground voltage according to a short control signal (supply voltage (e.g., 2 V)/ground voltage) and an inverter circuit 31b for controlling the gate of the n-channel transistor Q1 according to the output signal of the level shifter 31a. The inverter circuit 31b supplies the voltage $V_H$ or the ground voltage to the gate of the n-channel transistor Q1 according to the output signal of the level shifter 31a. The n-channel transistor Q1 turns on when a voltage equal to or higher than the threshold voltage VthN of the n-channel transistor is supplied to its gate and turns off when a voltage lower than the threshold voltage is supplied to its gate.

The driving circuit 32 is composed of a level shifter 32a for generating voltage $V_{SW}$ or the low-level voltage $V_{BB}$ on the word line according to the short control signal and an inverter circuit 32b for controlling the gate of the n-channel transistor Q2 according to the output signal of the level shifter 32a. The inverter circuit 32b supplies the voltage $V_{SW}$ or voltage $V_{BB}$ to the gate of the n-channel transistor Q2 according to the output signal of the level shifter 32a. The n-channel transistor Q2 turns on when a voltage equal to or higher than $V_{WL}+VthN$ is supplied to its gate, and turns off when a voltage lower than $V_{WL}+VthN$ is supplied to its gate.

The ground potential is supplied to the substrate of the n-channel transistor Q1 and the voltage $V_{WL}$ on the word line is supplied to the substrate of the n-channel transistor Q2. The gate of the p-channel transistor Q3 is grounded. The substrate is connected to the junction node N3 of the n-channel transistor Q1.

In addition, a transfer gate constituting the switch SW4 is connected between node N1 to which the substrate voltage $V_{well}$ is supplied and the ground. A transfer gate constituting the switch SW5 is connected between node N2 to which the voltage $V_{WL}$ on the word line is supplied and the ground. These switch circuits SW4 and SW5 are controlled by signals φ, /φ.

In FIG. 3, the decoder 15 illustrated as a inverter circuit and the switch SW2 can be replaced with an n-channel transistor. A power supply $V_{BB}$ is supplied to the source and substrate of the n-channel transistor, and a signal of $V_{SW}$ or $V_{BB}$ level is supplied to the gate of the n-channel transistor.

Figure 4:
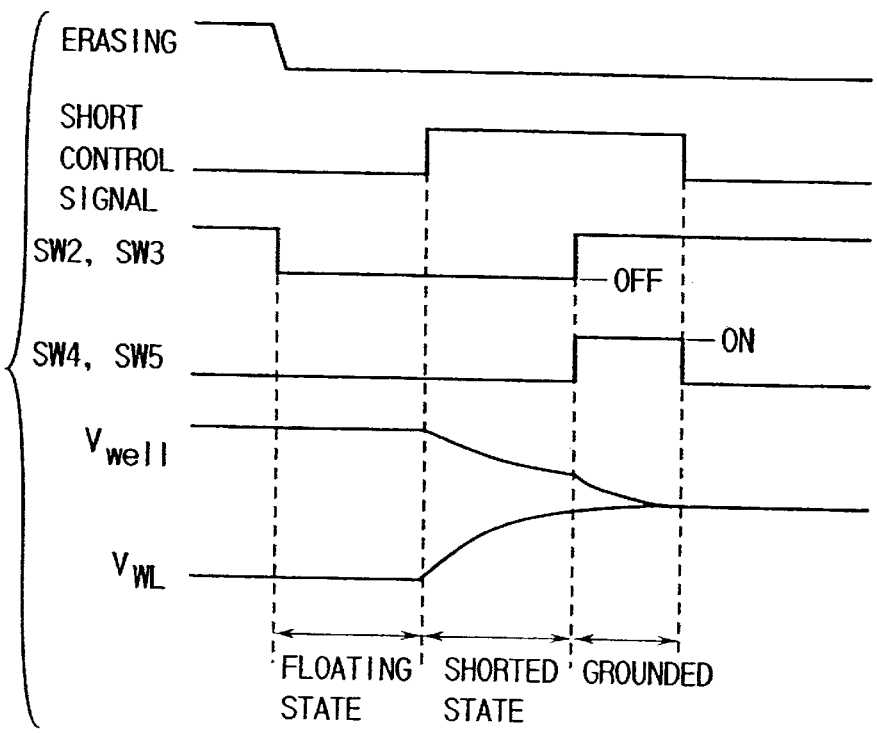
FIG. 4 is a waveform diagram to help explain the operation of FIG. 3.

Referring to FIG. 4, the operation of the above configuration will be explained.

The voltages $V_{well}$, $V_{WL}$ are applied to both ends of the parasitic capacitance C1. The potential difference $V_{well}-V_{WL}$ between the voltages $V_{well}$, $V_{WL}$ is about 20 V. After the memory cell array has been erased in blocks, the switch circuits SW2, SW3 are turned off, placing node N1 ($V_{well}$) and node N2 ($V_{WL}=V_{BB}$) in the floating state. Thereafter, the short control signal turns on the n-channel transistors Q1, Q2, thereby turning on the switch circuit SW1. As a result, both ends of the capacitance C1 are short-circuited by the transistors Q1, Q2, and Q3.

The p-channel transistor Q3 prevents the voltage at node N3 from dropping below the threshold voltage VthP of the p-channel transistor. If the p-channel transistor Q3 were absent, a very negative voltage would develop at node N3 as a result of the conduction of the n-channel transistor Q2, which might lead to a forward bias between the diffused layer of the n-channel transistor Q1 and the substrate. Alternatively, the conduction of the n-channel transistor Q1 would permit a high voltage to be applied to the diffused layer of the n-channel transistor Q2, which might break down the transistor Q2. The p-channel transistor Q3 prevents that problem. For this reason, the n-channel transistor Q1 operates at 10 V or below. Because of the well voltage<$V_{SW}$–VthN (VthN is the threshold voltage of the n-channel transistor), the p-channel transistor Q3 operates at 10 V or below. In this way, a voltage equal to 10 V or below is applied between the gate and the source/drain of each transistor.

As described above, a p-channel transistor Q3 is provided between the n-channel transistors Q1 and Q2, which enables each transistor to operate within the breakdown voltage. Consequently, there is no need to form a special high-breakdown-voltage transistor.

In the short-circuiting operation, the voltage $V_{well}$ at node N1 does not coincide completely with the voltage $V_{WL}$ at node N2. The reason is that the p-channel transistor Q3 turns off before those nodes have been short-circuited completely. Thus, after the short-circuiting has been done, the switches SW4, SW5 are turned on, thereby grounding node N1 and node N2 separately.

With the first embodiment, the switch SW1 is connected between node N1 to which the substrate voltage $V_{well}$ is supplied and node N2 to which the voltage $V_{WL}$ on the word line is supplied. After erasing has been done, the switch circuit SW1 is turned on, short-circuiting both ends of the parasitic capacitance C1. Thereafter, the switches SW4, SW5 ground node N1 and node N2. This prevents the well voltage or word-line voltage from overshooting or undershooting due to the parasitic capacitance C1 in a reset operation following an erase operation. As a result, not only latch-up caused by a forward bias is prevented, but also the breakdown voltage problem of the transistors is avoided.

In addition, the switch circuit SW1 is composed of a series circuit of the n-channel transistor Q1, p-channel transistor Q3, and n-channel transistor Q2. Each transistor can operate within a specified breakdown voltage range. In other words, both nodes which have a voltage difference between them higher than the breakdown voltage can be short-circuited using only transistors with a specified breakdown voltage. This eliminates the necessity of using high-breakdown-voltage transistors for short-circuiting, which prevents the manufacturing processes from becoming complex, the production cost from rising, and the cell layout from becoming intricate.

Furthermore, when node N1 and node N2 are short-circuited, the switches SW2, SW3 are turned off, which disconnects the first and second block decoders 15, 16 from node N1 and node N2. This enables only node N1 and node N2 supplying a potential to the control gate of a memory cell and the substrate to be reset independently, thereby placing node N1 and node N2 at the same potential at high speed.

Second Embodiment

Figure 5:
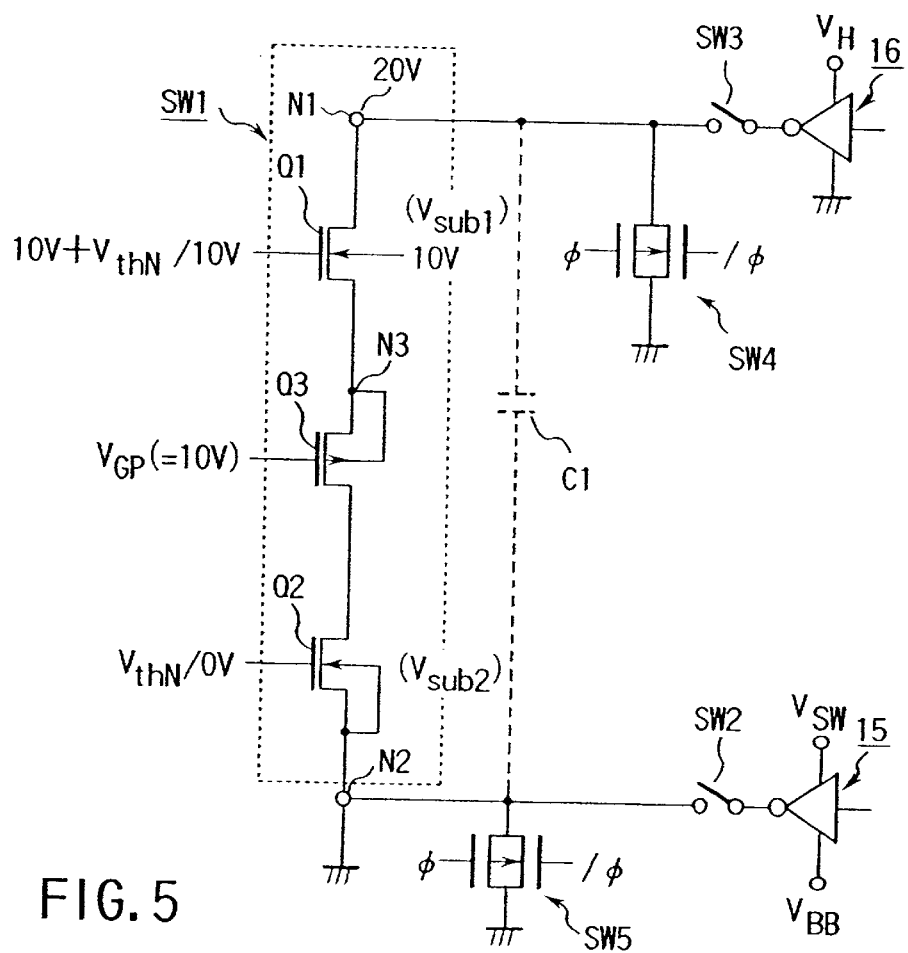
FIG. 5, which shows a second embodiment of the present invention, is a circuit diagram of the main parts.

FIG. 5 shows the main part of a second embodiment of the present invention. The same parts as those of FIG. 3 are indicated by the same reference symbols. While in the first embodiment, node N1 has been at a positive potential and node N2 is at a negative potential, the present invention is not restricted to this. In the second embodiment, node N1 is at, for example, 20 V and node N2 is at the ground potential. In this case, 10 V+VthN or 10 V is supplied to the gate of the n-channel transistor Q1 and the substrate voltage Vsub1 is set at 10 V. In addition, VthN or 0 V is supplied to the gate of the n-channel transistor Q2 and the substrate voltage Vsub2 is placed at the ground voltage. A voltage VGP=10 V is supplied to the gate of the p-channel transistor Q3. The relationship between the voltage VGP and the substrate potential Vsub1 of the n-channel transistor Q1 is set so as to fulfill VGP≧Vsub1. The gates of the transistors Q1, Q2 are controlled by a similar circuit to the control circuit 17.

With this configuration, too, each transistor is caused to operate within a specified breakdown voltage, thereby short-circuiting the parasitic capacitance C1.

While in the first and second embodiments, explanation has been given using a NOR flash EEPROM as an example, the present invention is not limited to the embodiments. For instance, the invention may be applied to not only a NAND flash EEPROM but also other semiconductor devices that are required to reset two leads between which a potential difference higher than the supply voltage develops.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first and a second node which have a potential difference equal to or higher than a supply voltage between them and are connected to each other via a parasitic capacitance;
   a first switch circuit which is connected between said first and second nodes, wherein the first switch circuit short-circuits said first and second nodes, and wherein said first switch circuit includes: (a) an n-channel first transistor one end of whose current path is connected to said first node, (b) an n-channel second transistor one end of whose current path is connected to said second node, and (c) a p-channel third transistor both ends of whose current path are connected to the respective other ends of the current paths of said first and second transistors;
   a second switch circuit which is connected between said first node and ground, wherein the second switch circuit is turned on after said first switch circuit has been turned on;
   a third switch circuit which is connected between said second node and ground, wherein the third switch circuit is turned on after said first switch circuit has been turned on; and
   a control circuit configured to control said first switch circuit, said control circuit turning on said first switch circuit after an erase operation.

2. The device according to claim 1, wherein:
   a first voltage is applied to a gate of the first transistor during short-circuiting, said first voltage satisfying a breakdown voltage condition;
   a second voltage is applied to a gate of the second transistor during short-circuiting, said second voltage satisfying a breakdown voltage condition; and
   a third voltage is applied to a gate of the third transistor, said third voltage is a constant voltage satisfying a breakdown voltage condition.

3. The device according to claim 2, wherein said first node is a node for supplying a potential to a well and said second node is a node for supplying a potential to a word line.

4. The device according to claim 3, wherein the voltage at said first node is a positive voltage and the voltage at said second node is a negative voltage.

5. The device according to claim 4, wherein said first voltage is one of a voltage equal to or higher than the threshold voltage VthN of an n-channel transistor and a voltage lower than said threshold voltage VthN, said second voltage is one of a voltage equal to or higher than said voltage V2+VthN (V2 is the negative voltage) and a voltage lower than said voltage V2+VthN, and said third voltage is a voltage equal to or higher than the substrate voltage of said first transistor.

6. The device according to claim 3, wherein the voltage at said first node is a positive voltage and the voltage at said second node is a ground voltage.

7. The device according to claim 6, wherein said first voltage is one of a voltage of Vsub1+VthN (Vsub1 is the substrate voltage of said first transistor and VthN is the threshold voltage of the n-channel transistor) and said voltage Vsub1, said second voltage is one of said threshold voltage VthN and said ground voltage V2, and said third voltage is a voltage equal to or higher than said substrate voltage Vsub1.

8. The device according to claim 1, wherein said first node is a node for supplying a potential to a well and said second node is a node for supplying a potential to a word line.

* * * * *